United States Patent
Ye et al.

(10) Patent No.: US 9,960,084 B1
(45) Date of Patent: May 1, 2018

(54) METHOD FOR FORMING SEMICONDUCTOR DEVICE

(71) Applicant: UNITED MICROELECTRONICS CORP., Hsin-Chu (TW)

(72) Inventors: Yi-Liang Ye, Kaohsiung (TW);
Kuang-Hsiu Chen, Tainan (TW);
Chun-Wei Yu, Tainan (TW);
Chueh-Yang Liu, Tainan (TW);
Wen-Jiun Shen, Yunlin County (TW);
Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/339,949

(22) Filed: Nov. 1, 2016

(51) Int. Cl.
*H01L 21/8238* (2006.01)
*H01L 29/161* (2006.01)
*H01L 29/49* (2006.01)
*H01L 29/66* (2006.01)
*H01L 21/311* (2006.01)
*H01L 27/092* (2006.01)

(52) U.S. Cl.
CPC ........ *H01L 21/823821* (2013.01); *H01L 21/31116* (2013.01); *H01L 21/823814* (2013.01); *H01L 21/823864* (2013.01); *H01L 27/0924* (2013.01); *H01L 29/161* (2013.01); *H01L 29/4916* (2013.01); *H01L 29/6653* (2013.01)

(58) Field of Classification Search
None
See application file for complete search history.

(56) References Cited

U.S. PATENT DOCUMENTS

| 7,413,961 | B2 | 8/2008 | Chong | |
|---|---|---|---|---|
| 8,404,546 | B2 | 3/2013 | Woon | |
| 9,634,002 | B1* | 4/2017 | Tsai | H01L 21/823468 |
| 2006/0073665 | A1* | 4/2006 | Jain | H01L 21/823814 |
| | | | | 438/303 |
| 2009/0075029 | A1* | 3/2009 | Thomas | H01L 21/02381 |
| | | | | 428/173 |
| 2009/0218633 | A1* | 9/2009 | Hoentschel | H01L 21/823807 |
| | | | | 257/369 |
| 2010/0025771 | A1* | 2/2010 | Hoentschel | H01L 21/26506 |
| | | | | 257/369 |
| 2010/0032715 | A1* | 2/2010 | Cheng | H01L 21/823807 |
| | | | | 257/190 |
| 2010/0047978 | A1* | 2/2010 | Tamura | H01L 21/823807 |
| | | | | 438/229 |
| 2011/0175140 | A1* | 7/2011 | Taylor | H01J 37/321 |
| | | | | 257/190 |

(Continued)

*Primary Examiner* — Evren Seven
(74) *Attorney, Agent, or Firm* — Winston Hsu

(57) ABSTRACT

The present invention provides a method for forming a semiconductor device, comprising the following steps: firstly, a substrate is provided, having a NMOS region and a PMOS region defined thereon, next, a gate structure is formed on the substrate within the NMOS region, and a disposal spacer is formed on two sides of the gate structure, afterwards, a mask layer is formed on the PMOS region to expose the NMOS region, next, a recess is formed on two sides of the gate structure spaced from the gate structure by the disposal spacer within the NMOS region, the disposal spacer is then removed after the recess is formed, and an epitaxial layer is formed into the recess.

11 Claims, 4 Drawing Sheets

(56) References Cited

U.S. PATENT DOCUMENTS

| | | | | |
|---|---|---|---|---|
| 2011/0309333 | A1* | 12/2011 | Cheng | B82Y 10/00 257/24 |
| 2013/0196495 | A1* | 8/2013 | Flachowsky | H01L 29/6653 438/585 |
| 2014/0011340 | A1* | 1/2014 | Song | H01L 29/6653 438/478 |
| 2017/0162663 | A1* | 6/2017 | Tsai | H01L 29/4983 |

* cited by examiner

METHOD FOR FORMING SEMICONDUCTOR DEVICE

BACKGROUND OF THE INVENTION

1. Field of the Invention

Embodiments of the invention generally relate to a method for forming a semiconductor device, and more particularly, to the method for removing a plurality of unwanted silicon seeds formed on a disposal material layer, and to improve the yield of the manufacturing process.

2. Description of the Prior Art

Size reduction of metal-oxide-semiconductor held-elect transistors (MOSFET) has enabled the continued improvement in speed, performance, density and cost per unit function of integrated circuits. One way to improve transistor performance is through selective application of stress to the transistor channel region. Stress distorts (i.e., strains) the semiconductor crystal lattice, and the distortion, in turn, affects the hand alignment and charge transport properties of the semiconductor. By controlling the magnitude and distribution of stress in a finished device, manufacturers can increase carrier mobility and improve device performance.

SUMMARY OF THE INVENTION

The present invention provides a method for forming a semiconductor device, comprising the following steps: firstly, a substrate is provided, having a NMOS region and a PMOS region defined thereon, next, a gate structure is formed on the substrate within the NMOS region, and a disposal spacer is formed on two sides of the gate structure, afterwards, a mask layer is formed on the PMOS region to expose the NMOS region, next, a recess is formed on two sides of the gate structure spaced from the gate structure by the disposal spacer within the NMOS region, the disposal spacer is then removed after the recess is formed, and an epitaxial layer is formed into the recess.

The feature of the present invention is that the silicon seeds 24 will be formed on the disposal material layer 22 after the first oxygen treatment P1 is performed, and the silicon seeds 24 will affect the yield of the manufacturing process. Therefore, in the present invention, the disposal material layer 22 and the silicon seeds 24 are entirely removed during the additional etching process E2, and thereby the issues such as the silicon seeds 24 growing up during the etching process E1 can be resolved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic cross section diagrams showing a semiconductor device according to the first preferred embodiment of the present invention, wherein:

FIG. 1 shows the schematic diagram of the semiconductor structure, including two gate structures on a substrate;

FIG. 2 shows the schematic diagram of the semiconductor structure after a disposal material layer is formed;

FIG. 3 shows the schematic diagram of the semiconductor structure after a plurality of epitaxial recesses are formed;

FIG. 4 shows the schematic diagram of the semiconductor structure after the disposal material layer is removed;

FIG. 5 shows the schematic diagram of the semiconductor structure after a anneal process is performed;

FIG. 6 shows the schematic diagram of the semiconductor structure after at least one epitaxial layer is formed within a first region;

FIG. 7 shows the schematic diagram of the semiconductor structure after at least one epitaxial layer is formed within a second region.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

The present invention provides a method for manufacturing epitaxial layers of a semiconductor device. Please refer to FIGS. 1-7, wherein FIGS. 1-7 are schematic cross section diagrams showing a semiconductor device according to the first preferred embodiment of the present invention.

Figure 1:
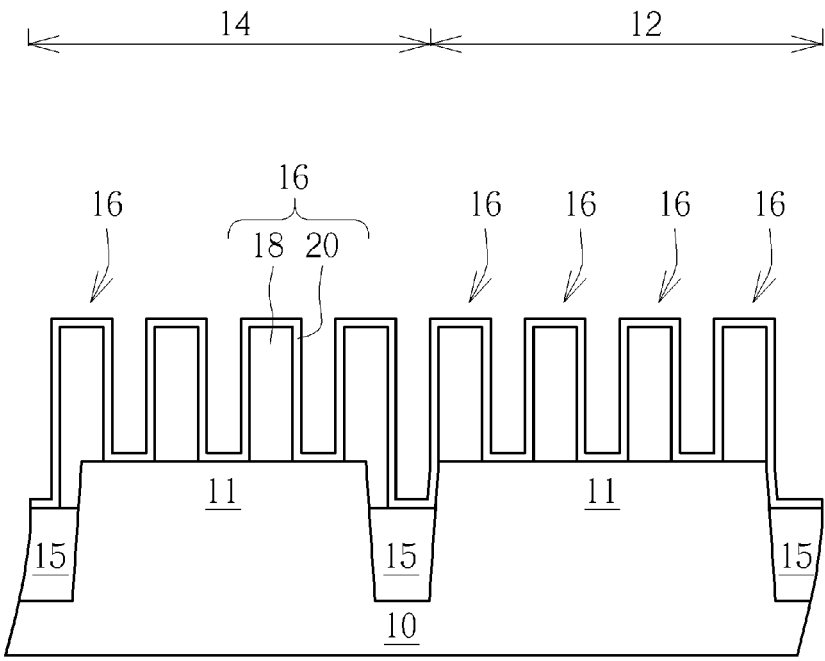

As shown in FIG. 1, a semiconductor device 1 includes a substrate 10, and a plurality of fin structures 11 are formed on the substrate 10. In the present invention, the fin structures 11 and the substrate 10 have identical material, and the fin structures 11 can be deemed as one part of the substrate 10. At least two regions: a first region 12 and a second region 14 are defined on the substrate 10, which respectively represent different regions of a semiconductor device 1. The difference between the first region 12 and the second region 14 is that the two different regions respectively comprise different conductivity types transistors disposed therein. For example, the first region 12 may be an NMOS region, which is used to accommodate n-type semiconductor devices, such as n-type metal oxide semiconductor field effect transistors (MOSFET), while the second region 14 is a region used to accommodate p-type semiconductor devices, such as p-type MOSFET.

In this embodiment, a plurality of shallow trench isolations (STIs) 15 are disposed in the substrate 10, at least disposed between the fin structures 11. And there are plurality of gate structures 16 disposed on the substrate 10 (on the fin structure 11) and disposed within the first region 12 and the second region 14. Each gate structure 16 at least comprises a gate electrode 18 and a spacer material layer 20 disposed on the gate electrode 18. In this embodiment, the gate electrode preferably includes polysilicon gates, but not limited thereto, the gate electrode may also comprises metal gates, and the spacer material layer 20 includes low dielectric constant (low-k) materials, such as SiCON or other suitable materials, in generally, the dielectric constant of these materials is about lower than 4, but the present invention is not limited thereto.

Figure 2:
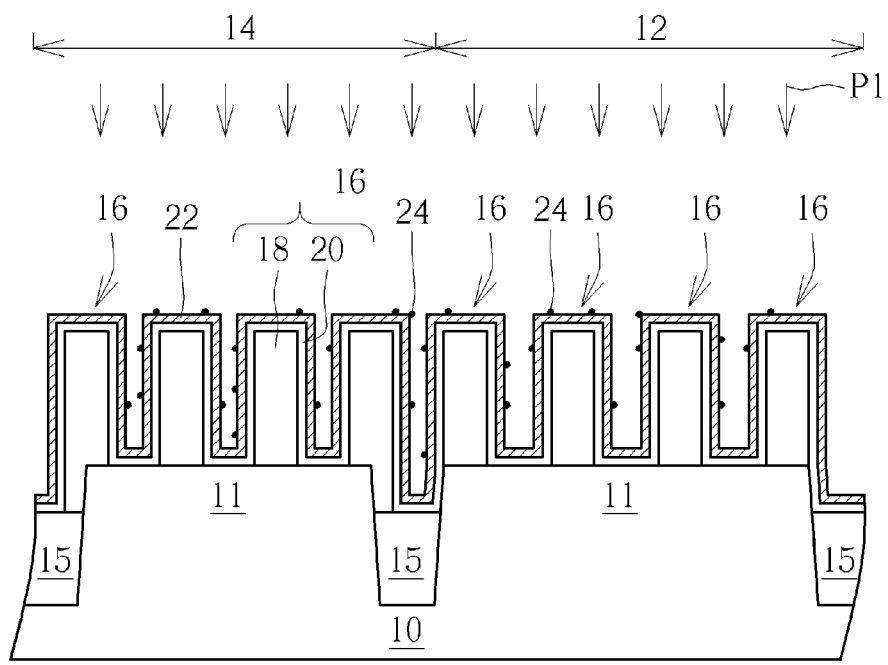

Next, as shown in FIG. 2, a disposal material layer 22 is entirely formed within the first region 12 and the second region 14, covering on the substrate 10 (on the fin structure 11) and on each gate structure 16. The material of the disposal material layer 22 includes materials such as silicon nitride (SiN), silicon carbonitride (SiCN) or silicon oxynitride (SiON), but not limited thereto. The purpose for forming the disposal material layer 22 mentioned above is to protect the following-formed spacers from the damages of the following-performed etching processes.

Figure 3:
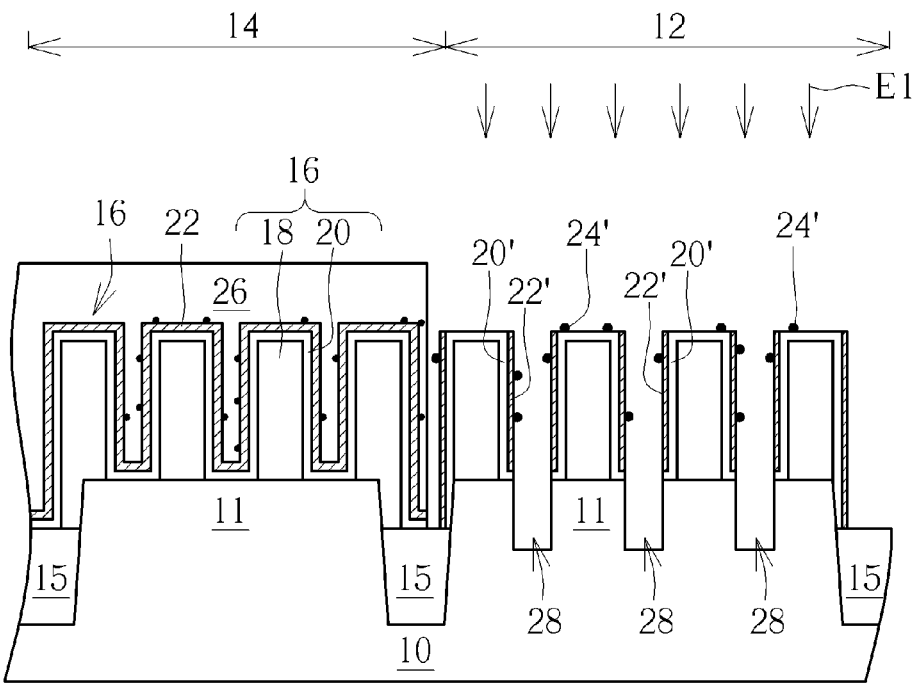

Afterwards, as shown in FIG. 3, a photoresist mask 26 is formed on the disposal material layer 22, the photoresist mask 26 only covers the second region 14 (such as the PMOS region), and the first region 12 (such as the NMOS region) is therefore be exposed.

It is noteworthy that in the present invention, after the disposal material layer 22 is formed and before the photoresist mask 26 is formed, as shown in FIG. 2, a first oxygen treatment P1 is performed on the disposal material layer 22, so as to form an oxide layer (not shown) on the surface of the disposal material layer 22. In this embodiment, the first oxygen treatment P1 is an in-situ oxygen treatment (such as an oxygen plasma process). In some cases, the temperature of the first oxygen treatment is higher than 250° C. According to applicant's experiment, the oxide layer formed on the disposal material layer 22 helps to improve the quality of the photoresist mask 26 that forms on the disposal material layer 22. In other words, the photoresist mask 26 can be formed on the disposal material layer 22 with oxide layer more easily. In another case, if the first oxygen treatment P1 is omitted, the photoresist mask 26 may not be formed on the predetermined place precisely.

However, since the first oxygen treatment P1 is performed after the disposal material layer 22 is formed, the disposal material layer 22 will be exposed in an oxygen environment, so the applicant found that a plurality of silicon seeds 24 will be formed on the surface of the disposal material layer 22 after the first oxygen treatment P1 is performed. The silicon seeds 24 will affect the quality of the manufacturing process of the present invention. For example, the existence of the silicon seeds 24 may cause the following formed epitaxial layer to form on unpredicted places, such as on the gate structure. The issue will be described again in the following paragraphs.

Next, please still refer to FIG. 3, an etching process E1 including an anisotropic etching process is performed within the first region 12, such as a vertical direction etching process using gases such as methyl fluoride ($CH_3F$) and oxygen ($O_2$), fluorine, chlorine, and/or hydrogen bromide, to etch parts of the spacer material layer 20, parts of the disposal material layer 22 and parts of the fin structure 11, and to form a plurality of epitaxial recesses 28 on two sides of each gate structure 16 within the first region 12. In addition, the spacer material layer 20 within the first region 12 is not removed entirely, and the rest of the spacer material layer within the first region 12 is defined as a plurality of first spacers 20', which are disposed on two sides of each gate electrode 18. Besides, the disposal material layer 22 within the first region 12 is partially removed, and the rest of the disposal material layer 22 within the first region 12 is defined as the disposal spacers 22', wherein the disposal spacers 22' are disposed on two sides of each gate structure 16. In other words, the disposal spacer 22' is formed on the sidewall of the spacer material layer 20.

The silicon seeds 24 still exist on the disposal spacers 22', and they will grow up while the etching process E1 is performed (for example, as shown in FIG. 3, since the etching process E1 is an oxygen containing process, and the silicon seeds 24 are exposed in an oxygen environment, the silicon seeds 24 will grow to silicon seeds 24') or after the following epitaxial process is performed (the applicant founded that in this case, the epitaxial layer will also be formed on the outer surface of each silicon seed). The silicon seeds 24 will affect the yield of the manufacturing process, for example, since the epitaxial layer will be formed surrounding each silicon seed 24, the epitaxial layer will be formed on some places where the epitaxial layer should not be formed (such as on the sidewalls of gate structure 16).

Figure 4:
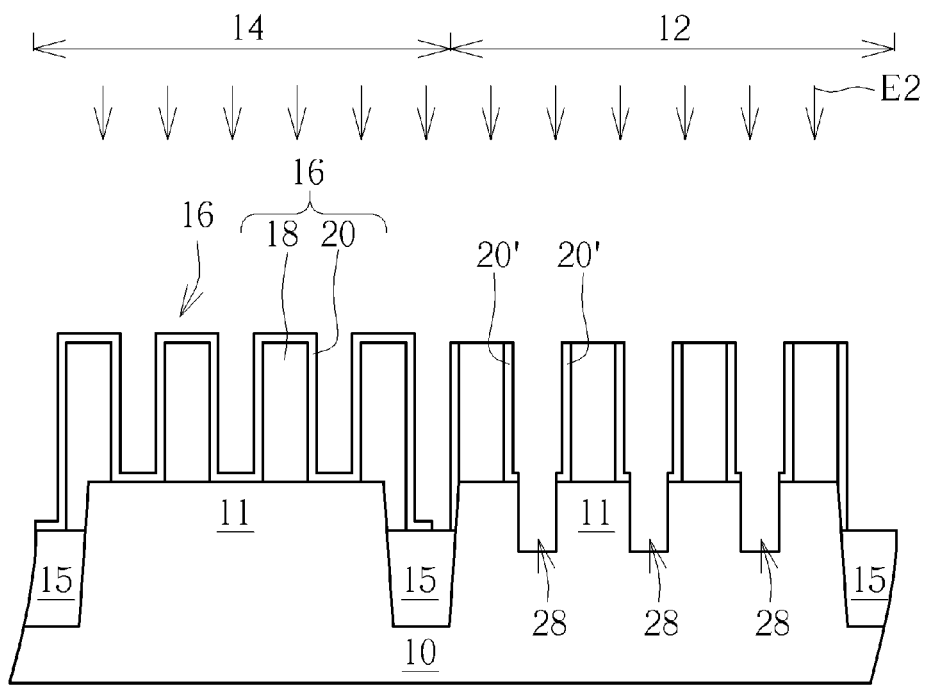

In order to resolve the issue mentioned above, in the present invention, please refer to FIG. 4, the photoresist mask 26 is removed through such methods as a second oxygen treatment (not shown). In this case, the second oxygen treatment is an oxygen plasma process, and the temperature is lower than 90° C. Next, after the photoresist mask 26 is removed, an etching process E2 is additionally performed, to further remove the disposal material layer 22 (within the second region 14), the disposal spacers 22' (within the first region 12) and the silicon seeds 24. The etching process E2 may be a dry etching process, a wet etching process or a combination thereof. In this exemplary embodiment, the process gas of the etching process E2 includes methyl fluoride ($CH_3F$) and oxygen ($O_2$). It is noteworthy that after the etching process E2 is performed, the first spacers 20' still exist on sidewalls of each gate electrode 18. Besides, in this step, the first spacers 20' are only disposed within the first region 12, but not disposed within the second region 14, and the second region 14 still has the spacer material layer 20 disposed therein (please refer to FIG. 3, since during the etching process E1, the spacer material layer 20 is protected by the photoresist mask 26 within the second region 14). In this step, since the silicon seeds 24 are removed during the etching process E2, the issues mentioned above (such as the silicon seeds 24 growing up during the etching process, and affecting the manufacturing process) can be prevented.

Figure 5:
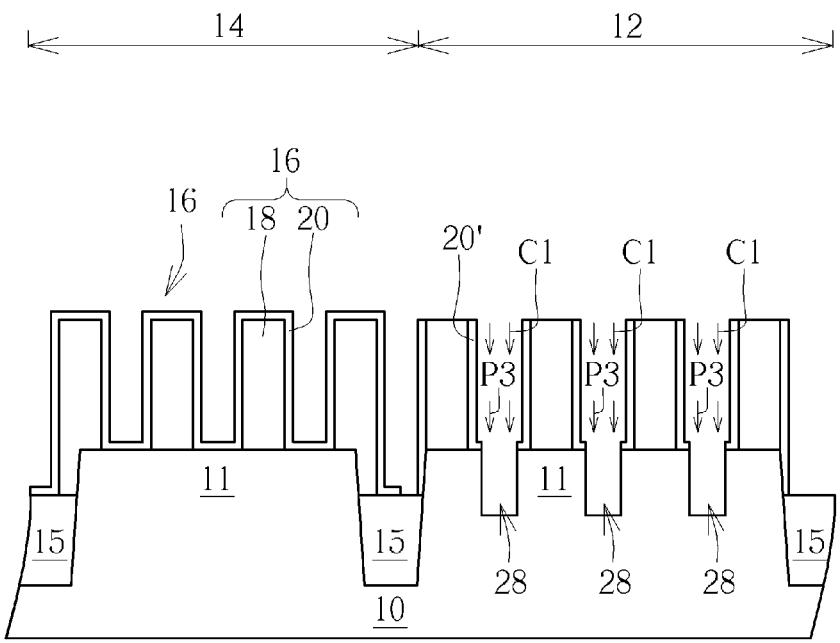

After the epitaxial recesses 28 are formed, as shown in FIG. 5, an anneal process P3 is performed on the epitaxial recesses 28. In this embodiment, the anneal process P3 causes the inner surface of each epitaxial recess 28 to re-crystallize, thereby improving the quality of the following-formed epitaxial layers in the epitaxial recesses 28. In some embodiments, the annealing process P3 is a furnace process, a rapid thermal annealing (RTA) process, a millisecond thermal annealing (MSA) process (for example, a millisecond laser thermal annealing process), or a microsecond thermal annealing ($\mu$SA) process. In some embodiments, after the anneal process P3 is performed, a clean process C1 is performed, to remove some impurities remained in the epitaxial recesses 28.

Figure 6:
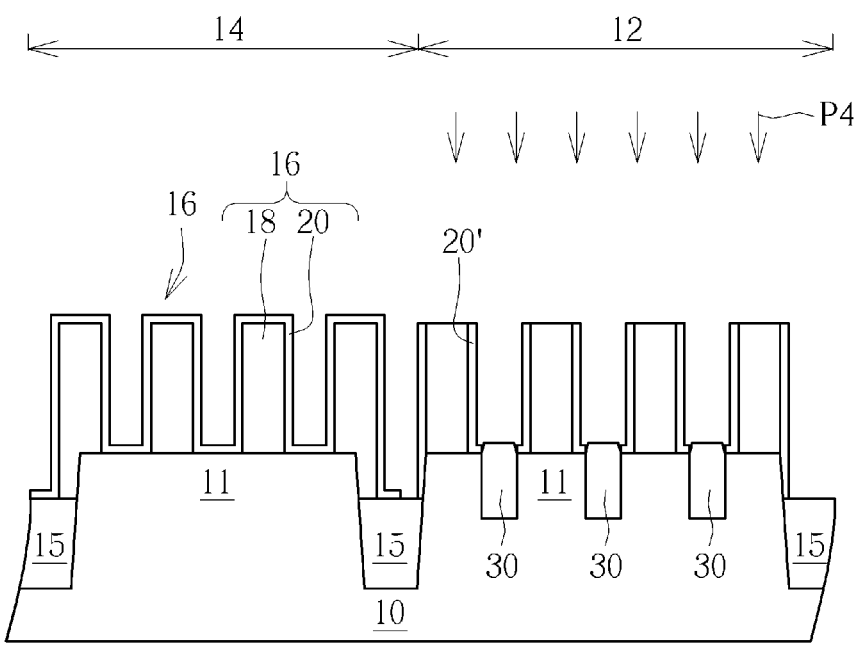

Next, as shown in FIG. 6, an epitaxial process P4 is performed to form an epitaxial layer 30 in each epitaxial recess 28 within the first region, wherein the epitaxial process P4 may be a molecular beam epitaxy (MBE), a co-flow epitaxial growth process, a cyclic selective epitaxial growth process or other similar processes. In this case, if the first region 12 is an NMOS region, the epitaxial layer 30 may include a silicon-carbide (SiC), a silicon phosphide (SiP) or a silicon carbon phosphorus (SiCP) epitaxial layer suited for an NMOS transistor. The epitaxial layer 30 is formed in each epitaxial recess 28, and grows conformally along the shape of the epitaxial recess 28. It is noteworthy that within the second region 14, since the spacer material layer 20 still covers the fin structure 11, the epitaxial layer 30 will not grow within the second region 14, but only disposed within the first region 12. In the present invention, the size (such as the width of the height) of each epitaxial recess 28 is preferably larger than 300 angstroms. Thereafter, an ion implantation process may be performed to dope impurities, or impurities may be doped while performing the epitaxial process P4, so that the epitaxial layers 30 can be used as a source/drain region.

Figure 7:
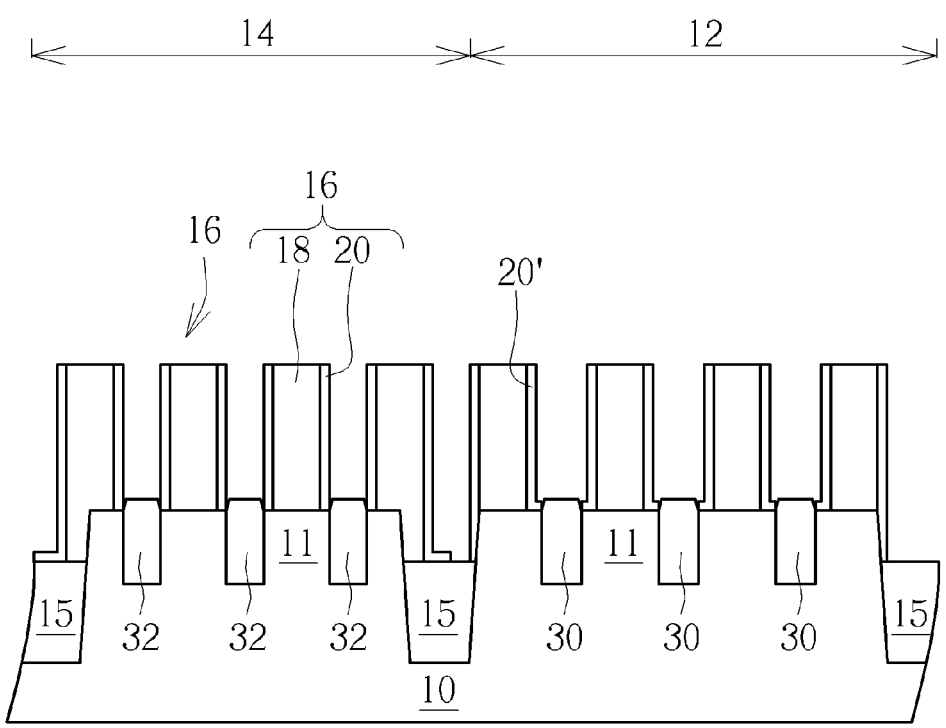

Finally, as shown in FIG. 7, in order to form the epitaxial layers in the second region 14 (such as a PMOS region), the processes mentioned above are repeated. Please refer to FIGS. 2-6 above, the steps at least includes: forming the disposal material layer within the first region 12 and within the second region 14; forming the photoresist layer within the first region 12; forming the epitaxial recesses within the second region 14; removing the disposal material layer; and performing an anneal process and an epitaxial process within the second region 14, so as to form a plurality of epitaxial layers 32 within the second region 14. In this case, if the second region 14 is a PMOS region, the epitaxial layer 32 may include a silicon-germanium (SiGe) epitaxial layer suited for a PMOS transistor. Thereafter, an ion implantation process may be performed to dope impurities, or impurities may be doped while performing the epitaxial process mentioned above (the process for forming the epitaxial layer 32), so that the epitaxial layers 32 can be used as a source/drain region.

After the epitaxial layers 30 and 32 are formed, a silicide process (or a salicide process, not shown) may be performed to form silicide in the source/drain region, wherein the silicide process may include a post clean process, a metal depositing process, an annealing process, a selective etching process, or a test process, etc. Thereafter, other processes may be performed after the silicide process is performed.

The key feature of the present invention is that the silicon seeds 24 will be formed on the disposal material layer 22 after the first oxygen treatment P1 is performed, and the silicon seeds 24 will affect the yield of the manufacturing process. Therefore, in the present invention, the disposal material layer 22 and the silicon seeds 24 are entirely removed during the additional etching process E2, and thereby the issues such as the silicon seeds 24 growing up during the etching process E1 can be resolved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
    providing a substrate, having a NMOS region and a PMOS region defined thereon;
    forming a gate structure on the substrate within the NMOS region;
    forming at least two inner spacers on the gate structure;
    forming a disposal spacer on the at least two inner spacers;
    performing an oxygen treatment on the disposal spacers, thereby forming silicon seeds on the disposal spacers;
    forming a mask layer on the PMOS region to expose the NMOS region;
    forming a recess on two sides of the gate structure spaced from the gate structure by the disposal spacer within the NMOS region;
    removing the disposal spacer and the silicon seeds after the recess is formed while maintaining the at least two inner spacers; and
    forming an epitaxial layer into the recess after the disposal spacer is removed.

2. The method of claim 1, further comprising performing an anneal process on the recess after the recess is formed and before the epitaxial layer is formed.

3. The method of claim 2, further comprising performing a clean process after the anneal process and before the epitaxial layer is formed.

4. The method of claim 1, wherein the epitaxial layer comprises SiP, SiC and SiCP.

5. The method of claim 1, wherein the disposal spacer comprises SiN, SiCN and SiON.

6. The method of claim 1, further comprising a plurality of fin structures disposed on the substrate.

7. The method of claim 1, wherein the epitaxial layer is larger than 300 angstroms.

8. The method of claim 1, further comprising forming at least one second epitaxial layer within the PMOS region.

9. The method of claim 8, wherein the second epitaxial layer comprises SiGe.

10. The method of claim 1, wherein the method for forming the recess comprise a dry etching process.

11. The method of claim 1, wherein the gate structure comprise a polysilicon gate electrode.

* * * * *